US006396344B1

(12) United States Patent
Gentzler et al.

(10) Patent No.: US 6,396,344 B1
(45) Date of Patent: May 28, 2002

(54) AMPLIFIER LINEARIZATION BY LEARNED LINEAR BEHAVIOR

(76) Inventors: Charles Gentzler, 1432 Conte de Primavera, Thousand Oaks, CA (US) 91360; Zvi Regev, 24217 Highlander Rd., West Hills, CA (US) 91307

( * ) Notice: Subject to any disclaimer, the term of this patent is extended or adjusted under 35 U.S.C. 154(b) by 0 days.

(21) Appl. No.: 08/785,752

(22) Filed: Jan. 18, 1997

(51) Int. Cl.$^7$ ................................................ H03F 1/26

(52) U.S. Cl. ....................................... 330/149; 330/136

(58) Field of Search ................................. 330/107, 129, 330/136, 149, 151; 375/296, 297; 455/126

(56) References Cited

U.S. PATENT DOCUMENTS

| | | | | |
|---|---|---|---|---|
| 4,250,457 A | * | 2/1981 | Hofmann | 329/364 X |
| 4,485,348 A | * | 11/1984 | Perkins | 329/364 |
| 5,049,832 A | * | 9/1991 | Cavers | 330/149 |
| 5,420,536 A | * | 5/1995 | Faulkner et al. | 330/149 |

OTHER PUBLICATIONS

Disclosure Document 396352 Apr. 15, 1996 "Amplifier Linearization By Adaptive Learned Behavior" Charles Gentzler and Zvi Regev.

* cited by examiner

Primary Examiner—Steven J. Mottola (57) ABSTRACT

This invention relates to the Linearization of multitone or multiple signal amplifiers or like devices. The telecommunications industry is currently employing amplifiers, transmitters or other active devices that are not only amplifying complex digital and analog modulation formats, but are transmitting or amplifying multiple complex signals simultaneously. In order to meet the transmission requirements, amplifiers or transmitters must exhibit extreme phase and amplitude linearity. Deviations from linearity are distortions which lead to intermodulation of the signal components; those intermodulation products appear variously through out the spectrum and cause interference between signals, which in turn degrades the amplified signals. Today the amplification of these signals requires the use of feedforward technology to achieve the performance required to meet government spectrum modulation mask requirements. This invention provides an important advance in the art of extreme phase and amplitude linearity.

17 Claims, 6 Drawing Sheets

Basic Form of the Invention

Figure 1 Prior Art Feedback

Figure 2 Prior Art Feedforward

Figure 3  Basic Form of the Invention

Figure 4  Invention with Convergence Accelerator

PRIOR ART Figure 5 Mixers, Envelope Encoders

Figure 5a Complex Mixer

Figure 5b Fullwave Envelope Detector

Figure 5c Envelope Amplitude /Frequency Encoder

Figure 5d Error Detector Relationships

Figure 6 First Preferred Embodiment

Figure 7 Second Preferred Embodiment

Figure 8 Process for Controlling Amplifier Distortion

Figure 9 Prior Art, Cravans

AMPLIFIER LINEARIZATION BY LEARNED LINEAR BEHAVIOR

BACKGROUND OF THE INVENTION

The recent advances in communication have give rise to applications where in a multiplicity of individual channels, each of relatively narrow bandwidth, are combined for transmission over a broadband channel. Thus 100 10 kHz might be combined for transmission over a T1 channel. Or 100,000 such channels might be combined for transmission over a fiber optic channel. Each of the individual channels might be assigned to various subscribers on a demand basis. Subscribers will come and go according to their requirements so that some channels occupancy will vary with random like rates. In addition subscribers might use different modulation techniques within their bandwidth. When such a channel is amplified by an amplifier which is non-linear in some characteristics, intermodulation products will be generated. Some of these products will fall within the bandwidth of other subscribers where they may degrade the integrity of that channel. The problem is not serious in older, analog telephone systems because of a listeners ability to hear conversation through the noise. With the advent of digital systems, data errors may occur which will require reducing data rates to accommodate error detection/correcting codes or multiple transmissions. It is an object of this invention to provide a means of controlling errors in amplifier characteristics so as to minimize the nonlinearities which cause intermodulation and increase the usable bandwidth of the channel. It should be noted that the term amplifier is used repeatedly in the description of the invention which follows but the application of this invention extends beyond amplifiers to virtually any non linear process where predistortion is an appropriate linearizing modality.

DESCRIPTION PRIOR ART

Figure 1:
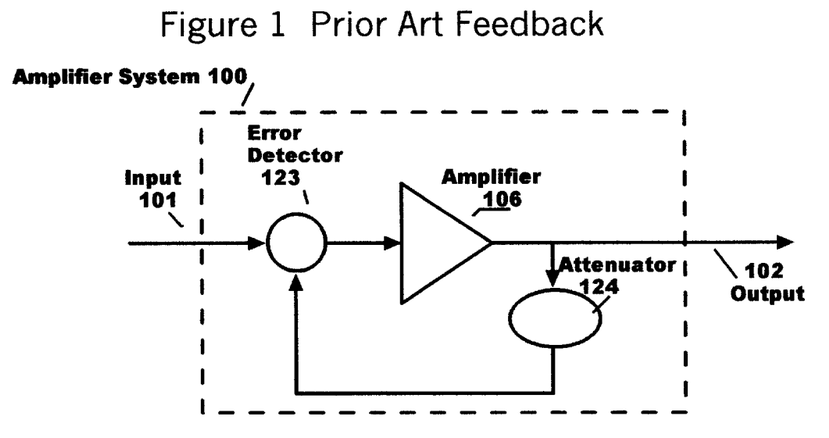
FIG. 1 Prior art in the use of Feedback to control amplifier distortion.

The traditional prior art for the sensing and control of amplifier distortions is feedback. Such a feedback system is shown in FIG. 1. Referring to FIG. 1 an Amplifier 106, with a gain of −G is to be controlled by feedback so that the gain of Amplifier System 100 gain is controlled to a prescribed value −G1. A portion of the output of Amplifier 106 is fed back through Attenuator 124, and subtracted from the Input in Error Detector 123. Attenuator 124, is set to the inverse of the prescribed gain of the Amplifier, here 1/G1. The difference signal from error detector 123, is Vout/G1−Vin, the amplification error, the difference between the input signal and the attenuated output signal. The detected error in the amplifier, is inverted in the Amplifier and subtracted from the output reducing the error. An error will exist so long as the Amplifier output does not meet the prescribed condition. Feedback is effective 1) so long as the amplifier gain is sufficient to reduce the error to nearly zero and 2) the feedback signal arrives at the amplifier input with an insignificant time delay.

Gain of an amplifier with feedback $$\text{Output} = -G * \left( \text{Input} + \frac{\text{Output}}{G1} \right) \quad (1)$$

where:

−G is the gain of amplifier 106

G1 is the prescribed gain of the amplifier

Gs is the gain of the amplifier system $$Gs = \frac{\text{Output}}{\text{Input}} = -\frac{G}{1 + \frac{G}{G1}}.$$

The basic equation for the system gain Gs is given in Equation 1 below. Note that as the amplifier gain G increases the system gain Gs approaches the prescribed gain G1. Time delay in the amplifier is inevitable and, with increasing frequency, the period of the input signal approaches the amplifier delay and this system reaches its limitation.

Figure 2:
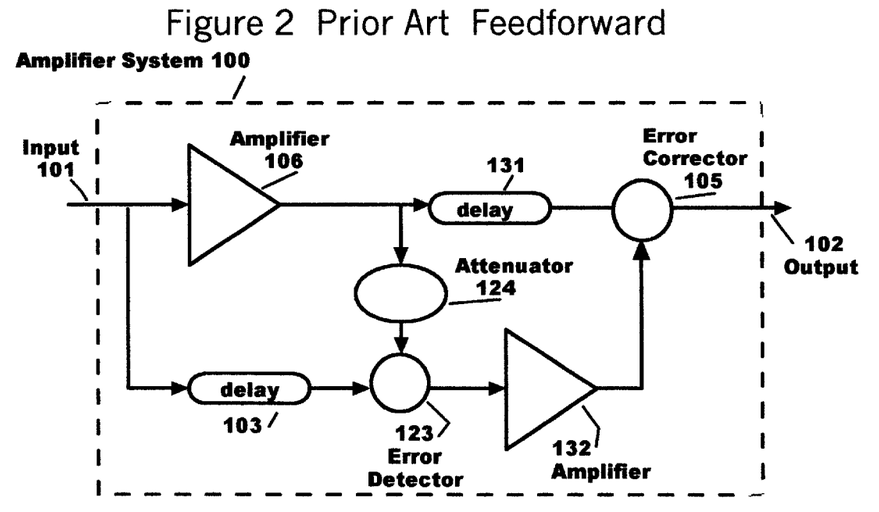
FIG. 2 Prior art in the use of Feedforward to control amplifier distortion.

The basic feed forward system is best understood with reference to FIG. 2 In FIG. 2, the function of the Input 101, Amplifier 106, Attenuator 124, and Error Detector 123, remain unchanged. Delay 103, has been added to balance, to the extent possible, the delay of the Amplifier 106 so that the attenuated output from the Amplifier and the delayed input signal arrive simultaneously at Error Detector 123. The output of the error detector is not fed back to the input of the Amplifier 106 but rather is input to Error Amplifier 132. The amplified error signal is added to output of Amplifier 106, after Delay 131, which balances the delay of Amplifier 132, so as to arrive simultaneously at Error Corrector 105 and correct the error. Since error correction flows forward this system is referred to as feedforward. In FIG. 1 the error correction flowed backward, hence the terminology feedback.

Since the signal error is generally a fraction of the amplifier output, the error amplifier can be smaller than the amplifier itself. Feedforward requires that the gain and delay characteristics of the amplifier and the error amplifier are precise and stable. Any error or drift in these characteristics will result in a failure to accurately correct the detects in the performance of the main amplifier. Feedforward, while achieving the required performance, is a complex and difficult technology to manufacture because the components must be manufactured to extremely tight tolerances to enable the complete feedforward system to meet its performance requirements. Any system component drift with temperature or will degrade the system performance and require realignment to achieve the required performance goals.

Conventional feedback and feedforward are thus ineffective in reducing distortion in broad band amplifiers. Feedback arrives too late and feedforward, being open loop requires precise balance of gains between Amplifiers 106 and 132 and that Amplifier 132 be distortion free.

The major drawback in the use of feedforward is that there is a very narrow range where the error amplifier is not overloaded by the desired signals. The typical feedforward system might include a 100 Watt main amplifier and a 20 Watt error amplifier coupled to the main amplifier through 10 dB directional couplers at the output and the input. In normal operation with a continuous two tone input the main amplifier and the error amplifier might have intermodulation products suppressed by 30 dBc, a typical value. The distortion output produced by the main amplifier is 100 mW. In order to cancel this product, the error amplifier, since it is coupled to the main amplifier through a 10 dB coupler must generate 1 W. The error amplifier has adequate power capability to cancel these distortion products. Suppose now that the input signals are changing in amplitude as in AM modulation, driving the main amplifier into mild compression so that its output is less than expected by 0.5 dB. The output should have been 113.6 W but is compressed to 100 W. In order to correct this amplitude distortion of 13.6 W., the error amplifier must product 136 W. into the 10 dB coupler. Of course, the error amplifier, capable of only 20 W. will be saturated and the feedforward loop's ability to cancel distortion will be severely compromised. If the feedforward system is operated with multiple FM (constant envelope) tones and there are greater than eight tones, the frequency at which these events occur is rare and the average power of the distortion products is acceptable.

The newer types of modulations in use today, CDMA, TDMA, TDMA burst mode, etc., contain considerable amounts of amplitude components so that amplitude limits of the main amplifier are frequently exceeded to limit the bandwidth of the modulation mask. Feedforward systems can have considerable problems with these modulation formats and may be forced to operate at reduced power to achieve satisfactory intermodulation performance.

There are several other techniques in the prior art to improve the performance of feedforward amplifiers operated with AM type signals. Passive predistortion and high speed first loops have been used improve the linearity of the main amplifier and prevent over driving the error amplifier. High speed first loops are described in the literature but these invariably introduce additional delay in the feedback path leading to the limitations previously mentioned.

Passive predistortion can achieve improvements over wider bandwidths but since it is an open loop system, it is hard to implement in a production environment. Adaptive control of a predistorter is limited by the fact that the predistorter must track the instantaneous dynamics of the signal, which requires very fast response. The adaptive controls as in conventional feed forward control, can only set an average operation point or level.

A further and more specific example of the prior art is found in *AMPLIFIER LINEARIZATION BY ADAPTIVE PREDISTORTION*, U.S. Pat. No. 5,049,832, James K. Cavers and shown in FIG. 5. Cavers describes an adaptive method of linearizing an amplifier to output in response to . . . an input modulation sample . . . . Cavers' invention like the present invention uses the envelope of input signal as the address for the memory and adapts the memory data on the basis of the input (delayed) and the amplifier output. Although modulation signals referred to by Carvers can be broadband Cavers shows nothing which would teach the application of his method of Linearization for modulation to broad band, high frequency signals. For example the path from the input to the predistortion modulator does not contain a delay element; the predistortion signal must race the input to the predistortion modulator. Even a modest delay in the envelope (squared magnitude) encoder and look up table of 10 ns. would allow a portion of input to pass the modulator without benefit of the predistortion. Cavers makes no reference to the desirability of frequency conversion of the amplifier input and output signals as a part of the adaptation process. As will become clear, frequency conversion makes it possible to compare the Input and Output in phase and amplitude at or near baseband while the amplifier itself operates at very high frequencies. Most importantly Cravers does not teach the desirability of using input frequency as a dimension in addressing the memory but relies solely on magnitude. It is well known to those skilled in the art of wideband amplifiers, that amplifier response, gain, phase and amplitude distortion change with signal frequency. Since distortion is a function of the signal level in the final stages of the amplifier, changes in gain will occur with changes in frequency and alter both amplitude and phase distortion.

OBJECTIVES OF THIS INVENTION

It is an object of this invention to provide an alternative to feedback and feedforward. The operation of this invention is based on the premise that for any amplifier, the distortion is determined by the state of the input envelope and further that there is a modified state of the input that will produce the ideal output, at least over a restricted range of inputs.

It is an objective of this invention to provide a method that would achieve linear performance, but would not be restricted in operating frequency range as is feedback and would not require the complexity and not require nearly as many tight tolerance building blocks of a feedforward system.

It is a further objective of this invention to provide a method to compensate for long term drifts of system components which drifts would otherwise cause increased distortion and to do so automatically.

It is an object of this invention to provide a means of reducing the distortion in amplifiers or other active devices by means of adaptive predistortion.

It is a further object of this invention to provide an adaptive predistortion mechanism which is capable of reducing distortion in broad band high frequency amplifiers or other devices where other distortion reduction by feedback or feed-forward would be impractical because of the wide range of frequencies in use.

It is a further object of this invention to provide an adaptive predistortion mechanism is capable of reducing distortion in broad band high frequency amplifiers or other devices in the face of changing conditions of age, temperature and component drift.

The present invention provides the capability to achieve these performance parameters in addition to achieving this performance more economically than conventional feedforward Linearization technology.

SUMMARY OF THE INVENTION

Amplitude and phase nonlinearities cause the generation of undesired or spurious outputs in amplifier transmitter, or other active device causing distortion of the information transmitted. In addition, if two or more signals are being amplified or transmitted, undesired intermodulation products are generated. The odd order products are the most troublesome since they fall close in to the desired signal and cannot be easily filtered. When we say that undesired frequencies are being generated, we are evaluating amplifier or transmitter nonlinearities in the frequency domain.

In a feedforward design, the distortion components of an amplified signal are amplified in an error amplifier, and combined with the distorted signal in a manner as to cancel the distortion of the main amplifier. This is a distortion in the frequency domain.

This invention is better understood by looking in the time domain at the distortion of the complex instantaneous voltage as it is passed through a nonlinear device. The instantaneous voltage is distorted in magnitude or phase or usually both to some degree. This is looking at the same distortion as mentioned earlier, but now we are evaluating it in the time domain. If it were economically practical to measure the instantaneous state descriptors of the input voltages at today's communication frequencies, we could predict the distortion which would result and correct it by predistortion of the input to the amplifier. Unfortunately the speed at which these instantaneous states change puts them beyond the sampling rates available with today's technology. The will likely remain beyond reach since modulations frequencies and sampling rates will both increase in the future.

Primary Descriptors of the Envelope State

Primary Envelope State Descriptors (2)

Magnitude: $M$ $$\frac{dM}{dt}$$

$$\frac{d^2M}{dt^2}$$

Frequency: $F = \frac{d\phi}{dt}$ $$\frac{dF}{dt}$$

$$\frac{d^2F}{dt^2}$$

This invention operates by making use of the fact that the information contained in the envelope[1] of a composite of multiple signals an important descriptor of the signal as relates to odd harmonic distortion, since those are generated by the peaks of the signal, and the envelope is actually changing much more slowly than is the instantaneous value of the composite. The state of the envelope of the composite signal may be made up of hundreds of individual modulated carriers as they add together but the envelope is a baseband signal, not a modulated carrier. These frequencies can be satisfactory digitized and correction applied. By the envelope is meant the magnitude of the real composite signal. The envelope state refers to the various factors which describe the envelope its frequency and amplitude and their derivatives, equation 2 above. These factors are important in that they influence the performance of devices such as amplifiers which follow. For example, it is often observed that the gain of an amplifier, indeed any circuit, varies with frequency and if the gain varies the amplitude of the output will vary and so will the distortion.

[1] By envelope is meant that locus of peak voltage excursions of signal. Thus for bandpass waveform $v(t)=Re\{g(t)e^{jwt}\}$ where $Re\{\}$ is the real part of $\{\}$, $g(t)$ is called the complex envelope consisting or real and imaginary parts $x(t)$ and $iy(t)$. The magnitude of the envelope is obtained from the magnitude $g(t)$ while the phase of $g(t)$ is $atan(y(t)/x(t))$. Details of the representation are given in Chapter 4 of *Digital and Analog Communications Systems, Second Edition*, 1987 by Leon W. Couch II.

This invention linearizes an amplifier or transmitting device by comparing the input signal with the output signal for particular states of envelope of the composite signal. Any difference between the input and output is due to distortion. The distortion component, a complex[2] quantity, is digitized and stored in a memory like device. The input envelope state descriptors are digitized to provide an address for the memory location. When the same input state occurs again, the same memory location is addressed, the correction is read and used to modulate or predistort the input signal prior to amplification. The resulting amplifier output is compared to the input, any residual distortion component is measured and combined with the correction read from memory in such a manner as to change the correction so as to further reduce the distortion at the next occurrence of this signal state. The changed correction is written into the same memory address. The state of the input envelope is sampled continuously and the said operation described above is performed for each state of the input envelope as they occur. As the envelope changes due to variations in, addition or elimination of signals, the signal envelope will change, corresponding errors will be measured and corrections updated and stored to improve the amplifier error performance.

[2] Complex refers to a notation for describing the amplitude and phase of a signal. Such quantities may be expressed in rectangular $A+jB$ or polar, Magnitude and phase, $M\angle\phi$.

The more uniform the gain and the phase performance of the amplifying or transmitting device is, the less error will be found and the less variation in correction will be found between different envelope states. Conversely, if the amplifier does not have flat gain and phase response, each time the signal changes, a large change in error will be found and the number of error measurement iterations will required to reach an acceptable error level and conversely more time will be required. Even so, the times required are not long. Iterations may be performed at a multi megahertz rate, billions per hour so that a modest learning period will provide excellent results.

Long term changes due to temperature and component aging will be automatically corrected as they occur and will most likely go unnoticed. In addition, since the correction factors are stored in a memory like device, interrogation of that memory will provide information as to the relative health of the amplifier. That is, if the corrections levels are excessively large, as would occur if their is an impending failure or an over power condition, corrective action could be taken before failure.

It should be noted that application of this invention is not limited to amplifiers. Any device, with an input and an output whereby errors in performance may be detected and corrected, can receive the benefit of this invention.

According to the method of this invention,
first) the distortions in the amplifier output, amplifier errors, are functions of the state of certain descriptors of the signal envelope. Further that it is possible encode the envelope state descriptors and to detect, measure and encode the amplifier errors corresponding to various states of the envelope and to build a multi-dimensional table of corrections vs descriptors.

second) as the signal is received to be amplified, the envelope state descriptors can be encoded, used to access the table and to retrieve corresponding correction previously stored and to use this stored correction to predistort the amplifier input so as to remove the error, and third) that because of the envelope changes relatively slowly as compared to the signal itself, that this can be accomplished in a manner timely to correct the corresponding errors before they occur.

Figure 3:
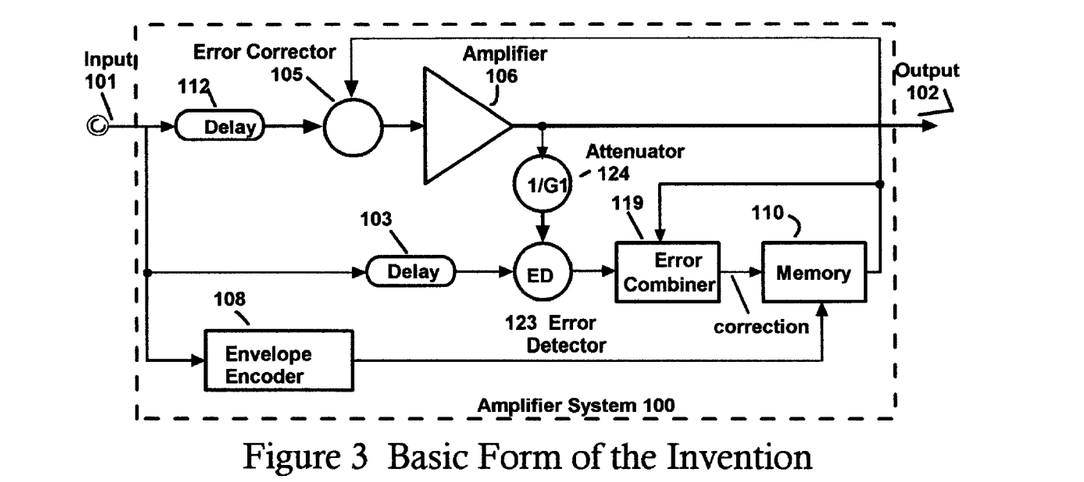
FIG. 3 This invention in its general form

The invention is best understood by reference to FIG. 3. The elements of FIG. 3 perform analogous functions to the corresponding elements of FIGS. 1 and 2. The Amplifier 106, has a gain G while the Amplifier System 100, is to be controlled to the prescribed gain of G1. The error detector 123, compares the Input Signal, 101, after a Delay 103, to time the arrival of the input signal to that of the Output Signal, 102 after attenuation and possibly phase shift corresponding to the prescribed amplifier performance. The error corrector 105, is interposed between the Input 101 and the main Amplifier, 106.

The envelope descriptors of the Input are measured by Envelope Encoder 108. These descriptors may include any measurable descriptor of the input envelope. Phase is not a measurable descriptor since it is only measurable against a reference and amplifier distortion is not known to be a function of signal phase, however the derivatives of phase, frequency and rate of change of frequency are measurable and important considerations in amplifier performance. Thus Amplitude, and its derivatives with respect to time, and Frequency and its derivatives with respect to time may be measured, encoded and combined to form a memory address. The memory becomes a multidimensional array of correction data.

The previously stored correction data is read from Memory, 110, and applied to the Error Corrector 105. The resulting, predistorted, signal is amplified by Amplifier 106 and its output, after attenuation, is compared to the delayed input in error detector 123. This residual error is combined in the Error Combiner 119, with the correction read from memory and used to improve the correction data so as to further reduce the error. The resulting correction is returned to memory for use at the next occurrence of the corresponding envelope state. This process is repeated continuously.

At turn-on, without intervention, the memory data may take on random values. Allowing this to happen would lead to random corrections initially and although these would eventually corrected, it is preferable to initialize the memory. Three choices for initial values are: mid-scale corrections, corrections which would cause Error Corrector to pass the signal unchanged 2) if the appropriate corrections can be anticipated, those could be loaded or if the system has been in operation in the past, the past values could be loaded or 3) values from a prior use could be retained. If the memory is non-volatile the initial values simply remain in place when power is removed; volatile memories would be loaded from a non-volatile memory at start-up.

The example convergence shown contains 30 cycles or iterations for one descriptor set. On each such cycle the error is measured and then combined with the old correction to calculate an improved correction.

Figure 8:
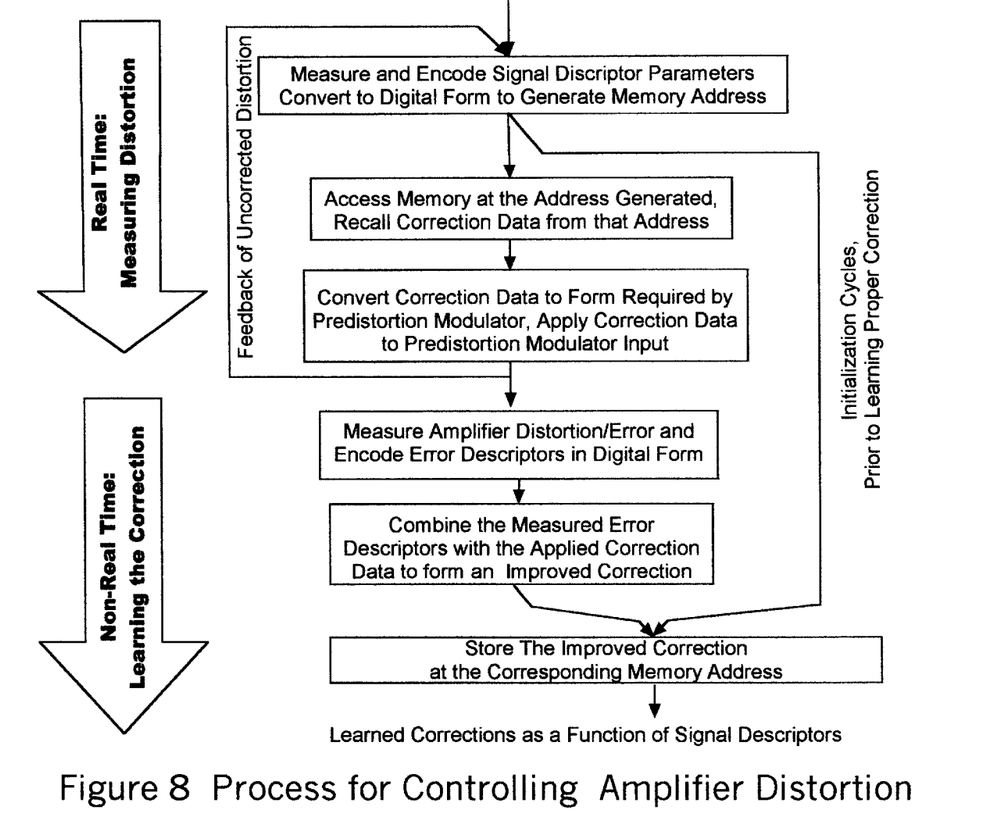
FIG. 8 Diagram of the Processes of this Invention.
Figure 9:
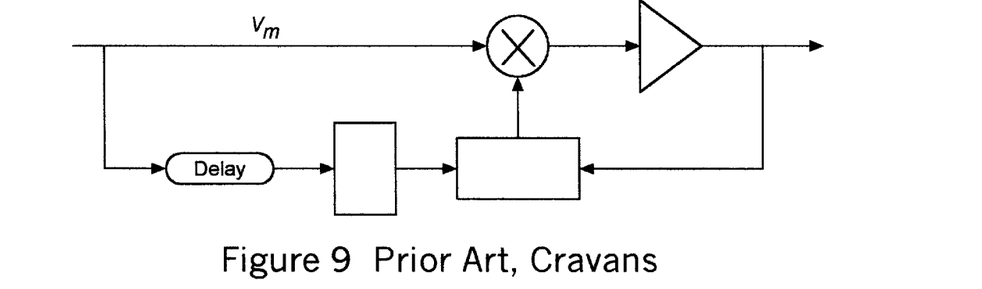
FIG. 9 Prior art adaptive control of Cravens U.S. Pat. 5,049,832.

The Process for the $n^{th}$ such cycle is described here and illustrated in FIG. 8:

PREDISTORTION PROCESSES
1) Measure and Encode Signal Descriptors Parameters,
   Convert to Digital Form,
   Generate Memory Address
2) Access Memory at the Address Generated,
   Recall Correction from that Address
3) Convert Correction Data to form required by the Predistortion Modulator,
   Apply Correction Data to the Predistortion modulator at the Amplifier Input LEARNING PROCESSES
4) Measure Amplifier Distortion/Error and
   Encode Error Descriptors in Digital Form
5) Combine the Measured Error Descriptors with the Applied Correction
   Data to Form an Improved Correction
6) Store the Improved Correction in Memory at the Corresponding Memory Address In this way the invention learns how to correct the amplifier error for each set of signal descriptors. The method of error combination and conversion to a correction by subtraction may be modified as required to deal with the parameters sought to be controlled. Thus errors or the output, modified in and amplitude minus the input modified in time. In a simple system, corrections are the negative or the error, modified by a gain factor Corrections are accumulated from iteration to iteration in the Error Combiner 119 of FIG. 3. Storage between iterations is provided by Memory 110.

Iterative Convergeance of Linear Amplifier with Complex Gain

Initial Conditions (3)

$$ER_{i,1} = \left(\frac{G \cdot C0}{P} - 1\right) \cdot \frac{k}{i}$$

$$C_{i,1} = C0$$

$$O_{i,1} = \frac{i}{k} \cdot G$$

Iteration $$ER_{i,n} = \left(\frac{G \cdot C_{i,n-1}}{P} - 1\right) \cdot \frac{i}{k}$$

$$C_{i,n} = ER_{i,n-1} \cdot \frac{k}{i} \cdot eg + C_{i,n-1}$$

$$O_{i,n} = \frac{i}{k} \cdot G \cdot C_{i,n-1}$$

where:
ER is Error
G is Gain of amplifier
i/k is input voltage n-tuple of i
C is correction
O is output If the amplifier characteristics were adequately defined, its errors might be corrected on the first attempt. This invention presumes that the characteristics are not known or vary due to changes in its environment or due to its age. The invention iterates the process above continuously, learning and relearning the correction requirements. A simple illustration of the convergence for a case where the gain is linear but complex and the prescribed is gain Real is given by the simultaneous equation and graph.

The invention will be adapted to each specific application. For more precise applications and those where the amplifier is highly non-linear it will be desirable to use multiple state descriptors while less precise or simpler applications may be well served with a single state descriptor. The overall complexity and the number of iterations required for convergence wile increase with the number of descriptors. A single three bit descriptor will require only eight memory cells while six descriptors with eight bits encoding will require 1536 memory cells. Each cell represents the iterative corrections for one envelope state. Assuming 50 iterations per cell, 75000 iterations will be required to complete the corrections.

The memory cycle corresponding to the steps above is read-modify-write. The process is carried out continuously causing memory cycles overlap as illustrated below. The memory reads and writes continuously and reads and writes simultaneously.

TABLE 1

Read-Modify-Write Memory Cycle

| read | modify | write | read | modify | write |
|---|---|---|---|---|---|
| write | read | modify | write | read | modify |
| modify | write | read | modify | write | read |

Simultaneous read and write is not a serious technological problem today. Even so, depending on the choice of memory elements, a great deal of external controls may be required to implement the simultaneous retrieve/store cycle. The mechanism for simultaneous recall/store is not a part of this invention. For the purpose of the explanations of these inventions which follow, the memory is presumed to provide simultaneous store/recall capability. It accepts at two addresses one for store and one for recall and provides to data ports, an input for data to be stored and an output for recalled data.

The application of the method of this invention is to provide, on each iteration, an output which is closer to the prescribed output than the output would have been without correction. Since every iteration will improve compliance with the prescribed performance repeated application, iteration. Driving the error towards zero does not guarantee that zero error will ever be achieved. It is well known in mathematics that a function may approach zero asymptotically and never reach zero. The rate of approach to the final value, the rate of convergence is then of great importance.

The rate of convergence can be improved by techniques known as acceleration. Many are known and in common use. They are due to mathematicians such as Atkin, Runga-Cutta, Newton and others. Of these, Newton's method is probably the simples and is illustrated below. This invention is not to be restricted to the application of Newtons method. Any method may be used, with selection based on system requirements and complexity. Where two or more errors are to be corrected, such as phase and amplitude, more complex two dimensional search techniques may be required.

Figure 4:
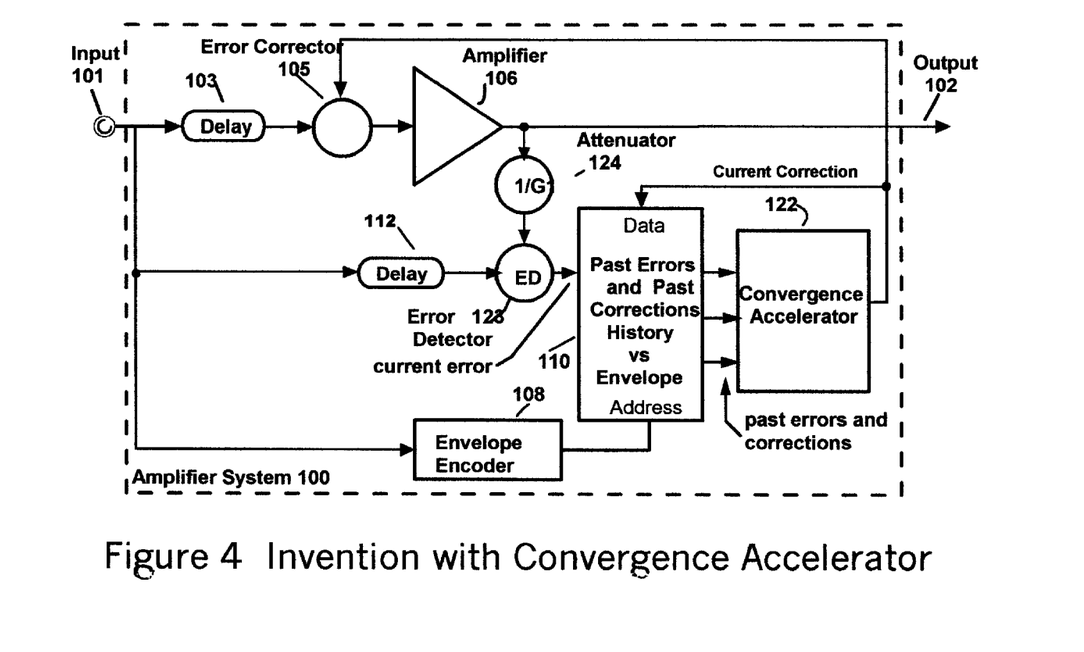
FIG. 4 This invention, including the use of convergence acceleration
Figure 5A:
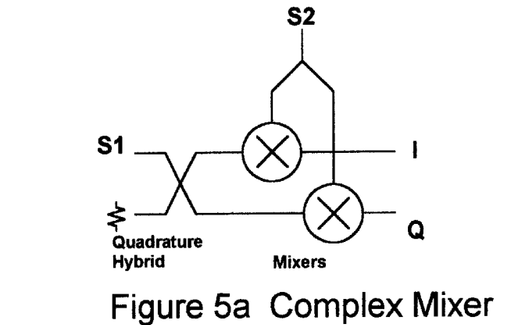
FIG. 5a Complex Mixer
Figure 5B:
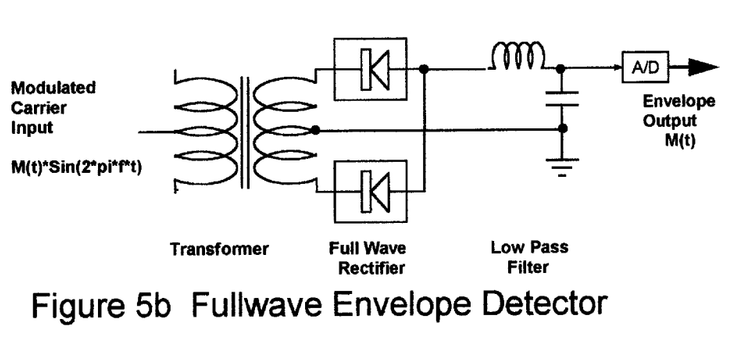
FIG. 5b Full Wave Envelope Detector
Figure 5C:
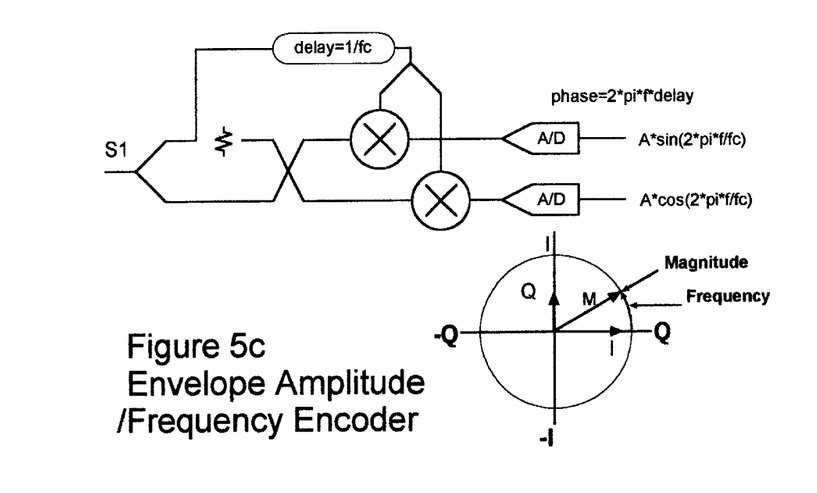
FIG. 5c Envelope Amplitude/Frequency Encoder
Figure 5D:
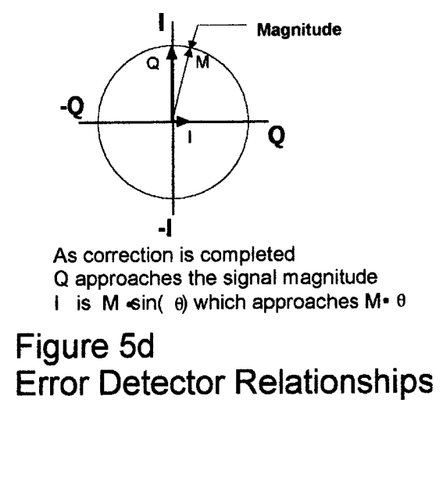
FIG. 5d Error Detector Relationships

In general, these techniques require that progress toward zero be monitored over two or more iterations and used to estimate the final value of correction. That correction is then applied on the next iteration. It is necessary to store several past values of the error and correction for each set of descriptors. These values are then processed according to the acceleration technique selected. The processor may contain more than one method for acceleration together with a means of selecting between them. This additional step is shown in FIGS 4. The Memory 110, now stores the history of the last n attempts to correct the amplifier error, Error vs Correction, for all envelope descriptor sets. When the data corresponding to a particular signal descriptor set is recalled, both the applied and the resulting errors corresponding to the previous n iterations are recalled. Those n sets of data are use in the computation of the new correction. The computed correction is stored in memory to be recalled on the next occurrence of that envelope state.

The methodology described to linearize the gain of an amplifier may be applied simultaneously to a plurality of amplifier parameters. These may include gain, phase, delay or other parameters. For each parameter appropriate means of means of measurement storage and correction together with a control processor or processing capability is required. In some cases a particular element can sense multiple different errors. Such an element is the complex multiplier, sometimes referred to by those familiar with the art as a correlator or as a quadrature mixer. The complex mixer generates the product of Signal 1 and Signal 2 at one output and the product of Signal 1 and Signal 2 rotated by $\pi/2$ at the other. The result, once unwanted sum terms are removed by filtering, are I and Q, the product of the amplitudes of Signal 1 and Signal 2 times the sine and cosine of the phase difference between Signal 1 and Signal 2, see Equation 4. If Signal 1 and I and Q are inputs to the Complex Multiplier, the output, Signal 2 is Signal 1 multiplied by the phase and amplitude represented by I+jQ. Signal 1 is rotated in phase by the arctangent of I/Q and multiplied in amplitude by $\sqrt{(I^n+Q^2)}$. The Complex Multiplier greatly simplifies the preferred embodiment of this invention. The description of the Preferred Embodiment refers to Complex Mixer rather than Complex Multiplier. Complex Multiplier is descriptive of the function to be realized while Complex Mixer is a physical device which realizes the function albeit with a host of imperfections. The effect of these imperfections are avoided by techniques familiar to those skilled in the art of RF engineering, impedance matching, drive level requirements, insertion loss, filtering of unwanted outputs and the like.

Complex Mixer as an Error Detector $$+\phi_1+\phi_2 \cdot e^{-j \cdot 2 \cdot \pi \cdot (f_1-f_2)+\phi_1-\phi_2} \quad (4)$$

(The frequency term) = $\sin(2 \cdot \pi \cdot (f_1 - f_2) + \phi_1 - \phi_2) + j \cdot co$

A BRIEF DESCRIPTION OF THE DRAWINGS

FIG. 5 Prior Art Mixers, Envelope Encoders

THE PREFERRED EMBODIMENT OF THE INVENTION

Figure 6:
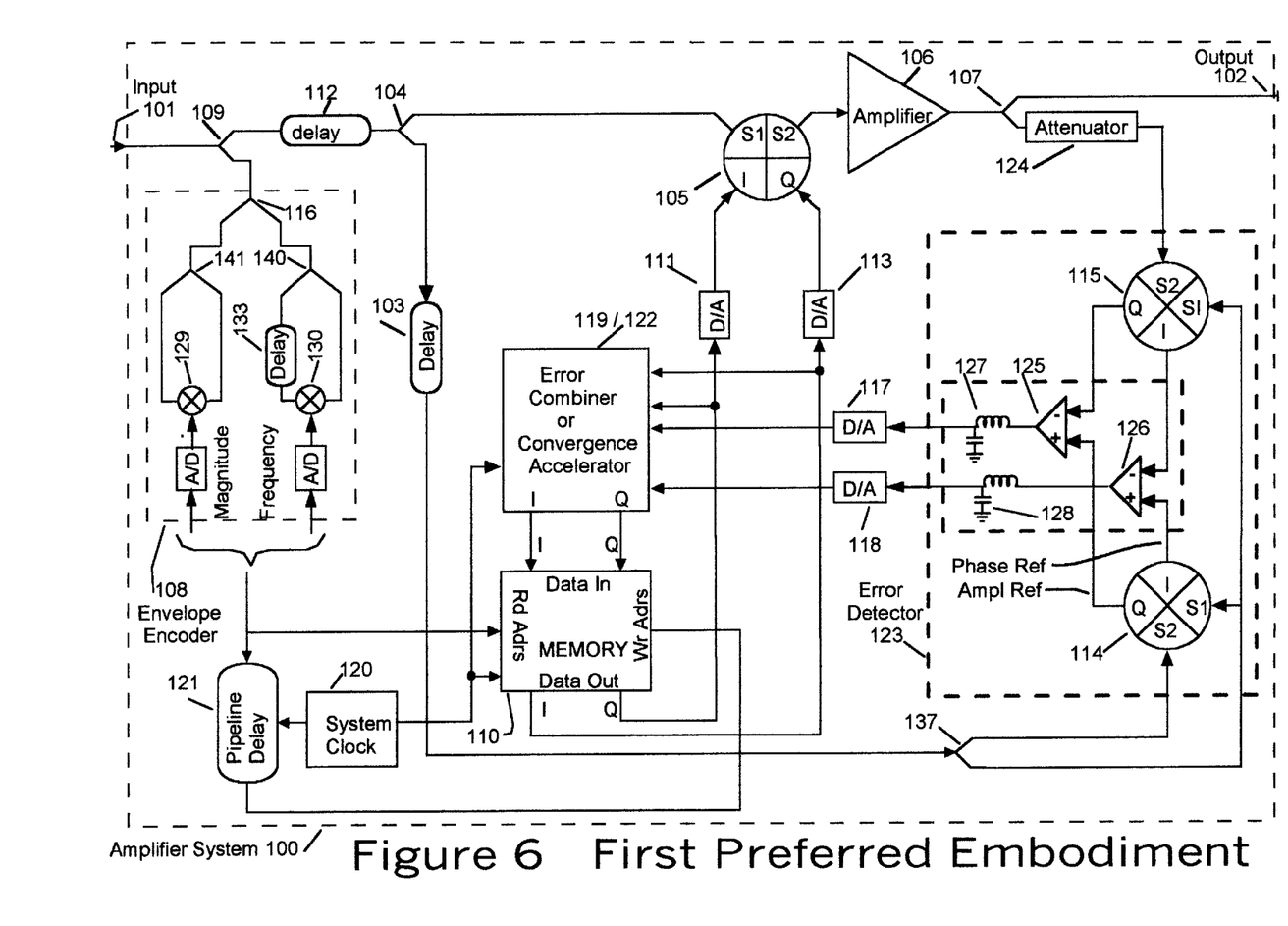
FIG. 6 First Preferred embodiment of this invention.
Figure 7:
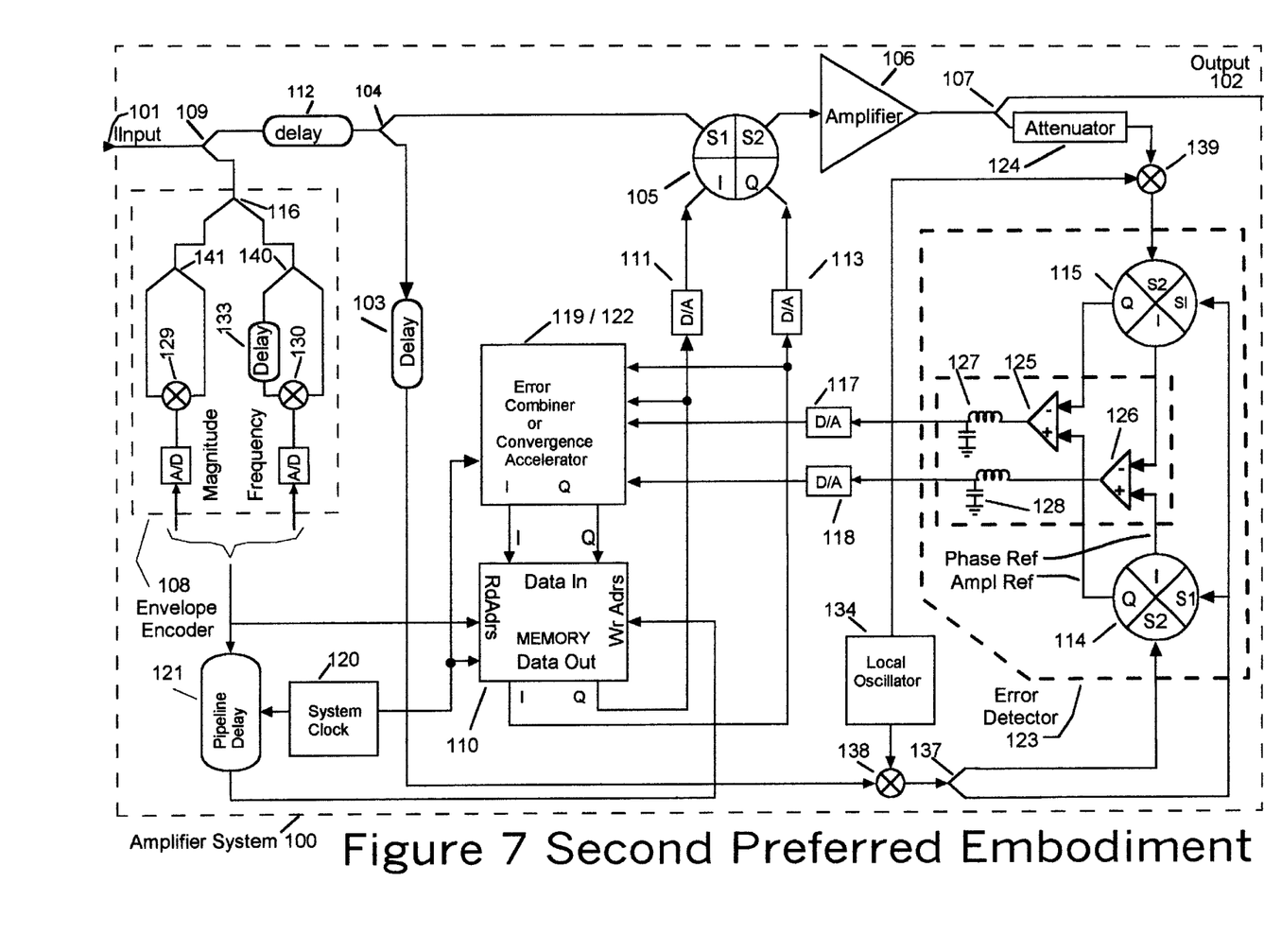
FIG. 7 Second Preferred embodiment of this invention incorporating down conversion prior to error detection.

The preferred embodiment of this invention is best understood be referring to FIG. 6. FIG. 6 includes practical component types and accounts for practical problems of broad band high frequency amplifiers such as power couplers, detectors, complex mixers and digital to analog conversion.

An input signal, broad band, extending to high frequencies and possibly the composite of a number of independent carriers each with complex modulation is applied to the Input 101 of the Amplifier System 100. Coupler 109, divides the signal between the Envelope Encoder 108 and Delay 112, from Delay 112 the signal is divided by Coupler 104, between Delay 103 to Error Detector 123 and the Error Corrector 105. The error corrector is implemented by complex mixer 105, from the corrector the signal flows to the input of Amplifier 106.

The description developed in terms of two important signal paths; 1) the real time predistortion path and 2) the non-real time learning path. Referring to the predistortion path, the signal from Coupler 109, is directed to the Envelope Encoder, 108. In those applications of this invention where the envelope amplitude alone is an adequate descriptor then an envelope detector followed by an A/D analog to digital converter would fill the requirement. In fact any of a wide variety or envelope detectors are familiar to those skilled in the art would serve the purpose. As speed of this path is critical, a full wave detector, one which converts both positive and negative excursions of the signal cycle to a single polarity is preferable. The preferred Embodiment uses a frequency a magnitude squared detector. The input signal from Coupler 116 is split again by couple 141 both outputs from the Coupler are multiplied by Multiplier 129 to produce the magnitude squared value. The product is filtered and converted by to digital form by an A/D converter.

The preferred embodiment uses both frequency and amplitude as descriptors of the signal. This encoding is best understood with reference to Envelope Encoder 108 of FIG. 6. The Envelope Encoder 108 develops frequency encoding by a delay line discriminator. The Input Signal is divided between magnitude and Frequency sections by Coupler 116. The path to the frequency encoder is limited by Limiter 137 then divided by Coupler 140 between on terminal of Multiplier 130 and Delay 133 to the other terminal of Multiplier 130. The result, at the mixer output, is $\text{Cosine}(2 \cdot \pi \cdot f \cdot \tau)$ where $\tau$ is the duration of Delay 133. $\tau$ is set to less than one half of the signal bandwidth to avoid ambiguity.

The outputs are filtered to remove ripple from the sum frequency or that due the wave shape of the composite signal, and encoded by A/D converters, 135, 136. The digital words representing I and Q and joined to form the encoder output. The encoder output of the A/Ds serves as the read address of the correction vs. signal descriptor Memory, 110. Note that it is not necessary to know the exact relationship between the address and the signal amplitude and frequency, it is sufficient that the address is a unique measure if the frequency and amplitude of the envelope.

The preferred embodiment controls two parameters of the Amplifier, 106, gain and phase. The output of the Memory 110, contains information for gain and Complex Mixer as A Predistortion Modulator $S1$ input signal = $e^{-j \cdot 2 \cdot \pi \cdot f_1 \cdot t + \phi_1}$ (5)

Correction signal magnitude, $M_{EC} = \sqrt{I^2 + Q^2}$

Correction signal phase, $\phi_{EC} = \operatorname{atan}(I/Q)$

Control Signal = $M_{EC} \cdot e^{-j \cdot \phi_{EC}}$ $S2$ output = $M_{EC} \cdot e^{-j \cdot 2\pi \cdot (f_1) \cdot t + \phi_1 + \phi_{EC}}$ phase correction in rectangular form, I and Q, at its data outputs. These are converted from digital to analog form by D/A converters, 111 and 113. The analog signals are sent to the Error Corrector 105, in the preferred embodiment, complex mixer 105. The complex mixer performs the pre-distortion modulation as indicated in Equation 5 Complex Mixer as a Predistortion Modulator.

In this way the magnitude and phase of Input signal 101 can be controlled or predistorted on its way to the Amplifier 106. Delay 112, delays the Input signal until the correction terms are in place. This completes real time path used to correct or predistort incoming signals using previously stored error values.

Now referring to the non-real time Learning Path, amplifier errors are detected by comparing the sample of the output signal from Coupler 107, to the Input signal from Coupler 104. The Input signal has been delayed by Delays 103 and 112. Delay 112 was necessary to insure synchronism in the predistortion path. The added Delay 103, compensates for the delay in Amplifier 106.

The error between the Input 101 and Output 102 is obtained by first down converting each signal to a intermediate frequency band using a Local Oscillator 134 and Frequency Mixers 129 and 130. The Local Oscillator frequency is chosen so that the intermediate frequency band is one wherein the Error Detector 123 which follows may be constructed with economical components and without the extraordinary difficulties which may be encountered at very high or very low frequencies. In this way the design of the error detector is not dictated by the signal frequency and a signal of 100 GHZ. might be controlled by an error detector operating at an intermediate frequency of 10 MHZ with an appropriate Local Oscillator and mixers. Note that the intermediate frequency ordinarily means the difference between the Local Oscillator and the signal frequency. If the sum frequency is generated it is to be removed by conventional means familiar to those skilled in the art.

There will occur applications in which the signal frequency is acceptable for error detection without down conversion. In these situations the Local Oscillator 134 together with Frequency Mixers 138 and 132 may be omitted.

Arriving at the error detector 123, the output level has been attenuated by Attenuator 124 to match the prescribed gain of the amplifier while the input has been delayed by Delay 103 to match the delay of the amplifier. In this way the input and output signals are expected to arrive at the error comparator equal in amplitude and simultaneously in time. Note that the arrangement of Delays, 103 and 112, and Couplers 109 and 103 is not exclusive. They serve to divide the Input signal between the Envelope Encoder 108, the Error Corrector 105, and the Error Detector 123 and assure synchronism between the correction data from the Memory 110, and the signal at the Error Corrector 105, and between the Input 101 and the Output 102 at the Error Detector 123. Any arrangement which assures these condition will serve the purpose of this invention. Thus prepared, thus amplitude and time and converted in frequency the input and output signals are processed as follows.

The input signal is split and mixed against itself in Complex Mixer 114. This generates an I signal proportional to the square of the real part of the signal voltage (Q=$\cos^2$ ($\phi$)); and a I signal proportional to the product of the real and imaginary parts of the signal (I=$\cos(\phi) \cdot \sin(\phi)$). The I and Q levels serve as references for the value the envelope and for the value of the zero reference.

Complex Mixer, 115 is driven by the down converted input signal and the down converted output level. The complex mixer produces I and Q baseband signals which are subtracted from the I and Q levels provided by the reference complex mixer 114 to yield the difference between the output and the input. Thus subtracting the output of Complex Mixer 114 from that of Complex Mixer 115 is equivalent to subtracting I(115) from I(114) and subtracting Q(115) from Q(114). The result is a new phasor $\Delta$ defined by $\Delta I$ and $\Delta Q$. These phasors express the phase and amplitude error of the output relative to the input.

Because of the constraints on I(114) and Q(114), as described above, and when the error is corrected the difference terms are zero; I(115)=I(114) and Q(115)=Q(114) and Input magnitude$^2$=Output magnitude$^2$(=$\cos^2(\phi)$) and 0=$\cos(\phi) \cdot \sin(\phi)$. Since $\cos(\phi)=1$, $\phi$ must be 0° and $\sin(\phi)=\phi$ (=0). Thus we have I(115)−I(114)≈Magnitude error and Q(115)−Q(114)≈$\Delta\phi$, the Phase error. The subtraction Q(115) from Q(114) and I(115) from I(114) is performed by difference Amplifiers 125 and 126. $\Delta I$ and $\Delta Q$ are then filtered by low pass Filters 127 and 128 to remove unwanted high frequency components and converted to digital form by A/Ds 127 and 128.

The measured errors are not directly usable as corrections. For example if the system is turned on and the amplifier is perfect, that is, distortionless, the magnitude error will be zero. If zero is used as a multiplicative correction, no signal reaches the amplifier. Note to that the complex mixer can not amplify the signal, rather it multiplies the signal but only by a factor less than unity and limited by the complex mixers conversion gain. In reality then it is that gain of the amplifier and the error corrector in cascade which is controlled to the prescribed gain. It is necessary to provide initial values for correction, presets in the memory, so that when the value retrieved and applied to the error corrector, the cascade gain of corrector and amplifier is near the prescribed value and can be either increased or decreased.

In particular operating condition results in an error, the value of that error is used to modify the correction presently in memory so as to further decrease the error. The past and present errors are combined and converted to a usable correction by the Error Combiner, 119.

The Error Combiner 119, is used in the preferred embodiment for those situations where convergence has proved not to require a large number of iterations. Where large nonlinearities exist or where performance requirements result in a large number of iterations, a convergence accelerator is used. In these situations the Preferred Embodiment incorporates a Newton's method accelerator. The accelerator calculates the derivative of the error with respect to the predistortion signal, then multiplying by the measured residual error, estimates the correction necessary to reduce the error to zero. The error E is a function F of the correction C for any descriptor D. dE/dC is the slope of the function. The estimate of the correction required to reduce the error to zero is found by extrapolating the slope to E=0.

Equations for Newton Accelerator $$E = F(c)|_D \qquad (6)$$

$$\frac{dC}{dE} = \frac{C_n - C_{n-1}}{E_n - E_{n-1}}$$

$$0 = E_n - \frac{dE}{dC} \cdot C_{n+1}$$

$$C_{n+1} = \frac{C_n - C_{n-1}}{E_n - E_{n-1}} \cdot E_n$$

Four values are needed for the calculation, the current error, just measured, the current correction the previous error and the previous correction. Three must be stored in the Memory. At the end of the calculation $C_n$ replaces $C_{n-1}$, $C_{n+1}$ replaces $C_n$, $E_n$ replaces $E_{n-1}$, and the calculation must be carried out for both I and Q.

A system clock (120) generates the digital timing required for controlling: the encoding of analog data to digital form, the reading and writing of the Memory and to set the timing for the digital pipeline delay (121). Additionally the System Clock is indicated as the source for the local oscillator for the Complex Mixers, 138, 139 in the Error Detector, 123. This is a matter of convenience for the explanation, synchronism between the local oscillator and the digital clocks is not required.

The memory cycle, Table 1 above, is read-modify-write, the read and write being conducted at the same address. The Pipeline Delay (121) delays the read address generated by the Envelope Encoder 108 until the modification, the Error Combining/Correction Calculation or in the alternative the Acceleration calculation process is completed. The delayed read address, now the write address reached the Memory 110 in synchronism to cause the up dated correction data to be written into the address from which it was read.

I claim the following:

1. A means and a method for controlling the transfer characteristics of a device comprised of means for:

a means for measuring the deviation of said characteristics from the desired value, a means for encoding certain descriptors of the input to said active device, a means for predistorting the input, prior to the action of said active device, a means for storing a set of correction parameters, according to said descriptors, a means of combining the present value of said deviation with the stored corrective parameters so as to further the corrective effect;

wherein the active device is an amplifier; and wherein the instantaneous input power is measured as a complex instantaneous peak or instantaneous envelope and is used to describe the signal the device is to handle wherein the output of deviation measuring device includes measures of amplitude deviation and phase deviation and wherein the said means is comprised of a frequency measuring device delay line discriminator.

2. A means and a method for controlling the transfer characteristics of a device comprised of means for:

a means for measuring the deviation of said characteristics from the desired value, a means for encoding certain descriptors of the input to said active device and a means for predistorting the input, prior to the action of said active device, a means for storing a set of correction parameters, according to said descriptors, a means of combining the present value of said deviation with the stored corrective parameters so as to further the corrective effects wherein the active device is an amplifier wherein the said table includes past values of deviations and corrections and wherein the method of combination considers these past values so as to compute an estimate of those corrections which will eliminate the deviations and wherein the measuring device is comprised of two complex mixers, two differencing devices, and two envelope detectors and a local oscillator.

3. An apparatus for controlling the gain of an amplifier comprised of an error measuring means, an error correcting means and memory means addressed according descriptors of the amplifier input and an error combining means which combines past corrections and present errors to improve control of the amplifier gain wherein the output signal is attenuated prior to error detection, wherein the error detecting means is comprised of a first complex multiplier forming the product of the input signal with itself and a second complex multiplier forming the product of the input and output signals and the error is formed from subtraction of the corresponding outputs of the reference and second complex multipliers and wherein output signals are converted to an intermediate frequency prior to error detection.

4. An apparatus for controlling the gain of an amplifier according to claim 3 in which the memory means stores a plurality of previously applied corrections and correspondingly measured remaining errors.

5. An apparatus for controlling the gain of an amplifier according to claim 4 in which the a plurality of previously applied corrections and correspondingly measure remaining errors is recovered from memory and an improved correction is generated based on said previously applied corrections and remaining errors.

6. A means for linearizing the transfer function of an amplifier system comprised of an envelope encoder device adapted to measure the magnitude, rate of change of magnitude, the frequency and rate of change of frequency of the input to the amplifier system an error correcting device adapted to modifying the input signal prior to amplification by the amplifying device an amplifier device an error detecting device adapted to determining the error of said amplifier output relative to the amplifier system input of the said amplifier system a memory device adapted to reading and writing amplifier error and correcting data at addresses in accordance with the said envelope encoder measurements an error combining means adapted to determining the appropriate correction based on current measurements of the input to the amplifier system made by the said envelope encoder, current measurements of amplifier error determined by the said error detector and past values of amplifier system error and correction.

7. A method and a means for linearizing the transfer function of an amplifier system according to claim 6 wherein the said envelope encoder is comprised of a magnitude detector, wherein a sample of the amplifier system input is multiplied with itself in a mixer, and a frequency detector wherein a sample of the amplifier system input is multiplied with a delayed sample of the amplifier system input.

8. A method and a means for linearizing the transfer function of an amplifier system according to claim 6, wherein the error detecting means for comparing the output of the active device to be linearized, with the input of said amplifier system is comprised of a first complex mixer means for mixing a sample of the input of the amplifier system with itself a second complex mixer means for mixing a simple of the input of the amplifier system with a sample of the output of the amplifier system a differencing means for subtracting the I and Q from each of said first and second complex mixers so as to form I and Q difference signals.

9. A means for linearizing the transfer function of an amplifier system according to claim 6 wherein the said error correcting device is a complex mixer.

10. A means for linearizing the transfer function of an amplifier system according to claim 6 wherein the error combining means is comprised of means for determining an improved correction to further improve linearity of the amplifier system considering the current correction applied and resulting together with the past history of, corrections applied and errors resulting.

11. A means for linearizing an amplifier according to claim 6;

wherein the said error detecting means includes, interposed between the sample amplifier system input and the error detector, and interposed between the sample of the amplifier system output the error detecting means; frequency mixers, having a common local oscillator, and configured to convert the amplifier system input and output samples to an intermediate frequency prior to error detection.

12. A means and a method for controlling the transfer characteristics of an amplifier system comprised of:

an error detector means adapted to comparing a delayed sample of the input to the amplifier system to an attenuated sample of the output of the amplifier system and providing therefrom an error detector data set, an input envelope encoder means adapted to measuring a set of envelope descriptors comprised of magnitude or magnitude squared and frequency, and providing therefrom an envelope encoder data set, an amplifier means whose transfer characteristic is to be controlled, an error corrector means adapted to modifying the amplifier system input to both magnitude and phase, prior to its presentation to the amplifier according to an error correction data set, a memory means and method adapted to accepting as an address the said envelope encoder data set and reading from and writing to that address a data set comprised of an immediate error correction data set for immediate application to the error corrector means together with a plurality of historical data sets, each set being comprised of, a previously applied error correction data set and a resulting error detector data set and an error combining means wherein the historical data set is supplemented by the said immediate correction data set and an error combining means wherein the historical data set is supplemented by the said immediate correction data set and wherein the supplemented data set is used to calculate a next immediate correction data set which replaces the former immediate correction data set in memory and wherein the most recent members of the supplemented historical data set are written to memory and the oldest member of the set is discarded and an Error Combining means adapted to accepting the said historical data set together with the existing immediate correction data set read from memory and the resulting error detected and calculating therefrom a new immediate correction data set.

13. A means and a method for controlling the transfer characteristics of an amplifier system according to claim 12 wherein;

The descriptors encoded is comprised of magnitude or magnitude squared, rate of change of magnitude or magnitude squared, frequency and rate of change of frequency.

14. A means and a method for controlling the trasnfer characteristics of an amplifier system according to claim 12 wherein the said input signal is delayed before reaching the error corrector in sufficient amount to allow establishment of the immediate error correction data in the error corrector prior to the arrival of the input signal.

15. A means and a method for controlling the transfer characteristics of an amplifier system according to claim 12 wherein:

the error detector is comprised of a reference quadrature mixer, mixing the delayed input signal against itself and an active quadrature mixer mixing the delayed input signal with the attenuated output signal and wherein the difference between the inphase outputs of the active and reference quadrature mixers forms the inphase component of the error detector output data set and the difference between the quadrature outputs of the active and reference quadrature mixer forms the quadrature component of the error detector output.

16. A means and a method for controlling the transfer characteristics of an amplifier system according to claim 12, wherein:

the delayed input signal and the attenuated output signal are converted to an intermediate frequency band prior to error detection.

17. A means and a method for controlling the transfer characteristics of an amplifier system according to claim 12 wherein:

the said transfer characteristic of the amplifier system to be controlled is the gain of the amplifier.

* * * * *